(12) United States Patent
Huang

(10) Patent No.: US 10,607,926 B1
(45) Date of Patent: Mar. 31, 2020

(54) PREFORMED LEAD FRAME DEVICE

(71) Applicant: CHANG WAH TECHNOLOGY CO., LTD., Kaohsiung (TW)

(72) Inventor: Chia-Neng Huang, Kaohsiung (TW)

(73) Assignee: CHANG WAH TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/502,122

(22) Filed: Jul. 3, 2019

(30) Foreign Application Priority Data

Apr. 17, 2019 (TW) .............................. 108204696 U

(51) Int. Cl.
*H01L 23/495* (2006.01)
*H01L 23/31* (2006.01)
*H05K 1/03* (2006.01)

(52) U.S. Cl.
CPC .. *H01L 23/49541* (2013.01); *H01L 23/49503* (2013.01); *H01L 23/49582* (2013.01); *H01L 23/49586* (2013.01)

(58) Field of Classification Search
CPC ............. H01L 21/4821; H01L 21/4832; H01L 21/561; H01L 21/67144; H01L 21/78; H01L 21/4828; H01L 23/49541; H01L 23/49503; H01L 23/49582; H01L 23/49586; H01L 23/495; H01L 23/31; H01L 23/49558; H01L 23/49861; H01L 23/49548; H01L 23/3107; H01L 23/3121; H01L 23/4952; H01L 23/49537; H01L 23/49575; H01L 2224/48091; H01L 2224/48247; H01L 2224/97; H05K 1/03
USPC .......................................... 174/255; 257/676
See application file for complete search history.

(56) References Cited

U.S. PATENT DOCUMENTS 9,934,989 B1 * 4/2018 Williamson ...... H01L 23/49861

FOREIGN PATENT DOCUMENTS

| TW | M523189 | | 6/2016 | | |
| TW | M551755 | * | 11/2017 | ........... | H01L 23/495 |
| TW | M551755 U | * | 11/2017 | ....... | H01L 23/49503 |

* cited by examiner

*Primary Examiner* — Timothy J Thompson
*Assistant Examiner* — Guillermo J Egoavil
(74) *Attorney, Agent, or Firm* — Burris Law, PLLC

(57) ABSTRACT

A preformed lead frame device includes multiple spaced-apart longitudinal sections, multiple spaced-apart transverse sections intersecting the longitudinal sections, and multiple preformed lead frame units each surrounded by two adjacent ones of the longitudinal sections and two adjacent ones of the transverse sections. Each of the preformed lead frame units includes a die pad sub-unit including a die pad portion, multiple pillar portions, and a first gap formed among the die pad portion and the pillar portions, a lead sub-unit including leads and a second gap formed among the die pad sub-unit and the leads, an adhesion-strengthening layer disposed in the first and second gaps, and a molding layer filling the first and second gaps to cover the adhesion-strengthening layer.

9 Claims, 5 Drawing Sheets

PREFORMED LEAD FRAME DEVICE

CROSS-REFERENCE TO RELATED APPLICATION

This application claims priority of Taiwanese Utility Model Patent Application No. 108204696, filed on Apr. 17, 2019.

FIELD

The disclosure relates to a preformed lead frame device, and more particularly to a preformed lead frame device having an adhesion-strengthening layer.

BACKGROUND

Referring to FIG. 1, a conventional quad flat no-lead (QFN) lead frame includes an outer frame 11, a metallic die pad 12 surrounded by the outer frame 11, a connecting portion 13 connected to the metallic die pad 12 and the outer frame 11, and a plurality of spaced-apart leads 14 that extend from the outer frame 11 toward the metallic die pad 12 and that are spaced-apart from the metallic die pad 12. Referring to FIG. 2, when the conventional QFN lead frame is packaged, a chip 100 is first disposed on the metallic die pad 12, and then a plurality of wires 15 are connected to the chip 100 and the spaced-apart leads 14. Finally, the chip 100 and the outer frame 11 are covered by a polymeric encapsulating material, followed by curing the polymeric encapsulating material to form a polymeric encapsulating layer 16, thereby obtaining a conventional chip packaging device.

However, considering that the operability of the packing process and poor adhesion strength between the polymeric encapsulating layer 16 and the metallic die pad 12 may adversely affect reliability and performance of the chip packaging device, a ratio of an area of a surface of the chip 100 attached to the metallic die pad 12 to an area of a surface of the metallic die pad 12 for disposing the chip 100 is generally controlled by reducing heterogeneous interfaces between the polymeric encapsulating layer 16 and the metallic die pad 12. However, there is still a room for improving adhesion strength between the polymeric encapsulating layer 16 and the metallic die pad 12 in the conventional chip packaging device.

SUMMARY

Therefore, an object of the disclosure is to provide a preformed lead frame device that can alleviate at least one of the drawbacks of the prior art.

According to the disclosure, a preformed lead frame device includes a plurality of spaced-apart longitudinal sections, a plurality of spaced-apart transverse sections intersecting the longitudinal sections, and a plurality of preformed lead frame units each surrounded by two adjacent ones of the longitudinal sections and two adjacent ones of the transverse sections. Each of the preformed lead frame units includes a die pad sub-unit, a lead sub-unit, an adhesion-strengthening layer, and a molding layer.

The die pad sub-unit includes a bottom portion, a die pad portion that extends upwardly from the bottom portion and that has a pad top surface opposite to the bottom portion, a plurality of spaced-apart pillar portions that extend upwardly from the bottom portion and that surround the die pad portion, each of the pillar portions having a pillar top surface opposite to the bottom portion, and a first gap formed among the die pad portion and the pillar portions. The bottom portion, the die pad portion and the pillar portions cooperatively define a first gap-surrounding surface that is exposed to the first gap.

The lead sub-unit includes a plurality of spaced-apart leads extending from the two adjacent ones of the longitudinal sections and the two adjacent ones of the transverse sections toward the die pad sub-unit, each of the leads having a lead top surface opposite to the bottom portion of the die pad sub-unit, and a second gap formed among the die pad sub-unit and the leads. The leads and the die pad sub-unit cooperatively define a second gap-surrounding surface that is exposed to the second gap.

The adhesion-strengthening layer includes a first adhesion portion disposed in the first gap to cover the first gap-surrounding surface, and a second adhesion portion disposed in the second gap to cover the second gap-surrounding surface.

The molding layer is made of a polymeric material, and includes a first molding portion filling the first gap and covering the first adhesion portion of the adhesion-strengthening layer, a second molding portion surrounding the pillar portions and the first molding portion, and a third molding portion filing the second gap and covering the second adhesion portion of the adhesion-strengthening layer.

The first molding portion includes a first top surface opposite to the bottom portion of the die pad sub-unit. The second molding portion includes a second top surface opposite to the bottom portion of the die pad sub-unit. The pad top surface of the die pad portion and the pillar top surfaces of the pillar portions are flushed with the first top surface of the first molding portion. The first top surface of the first molding portion and the second top surface of the second molding portion are different in height.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
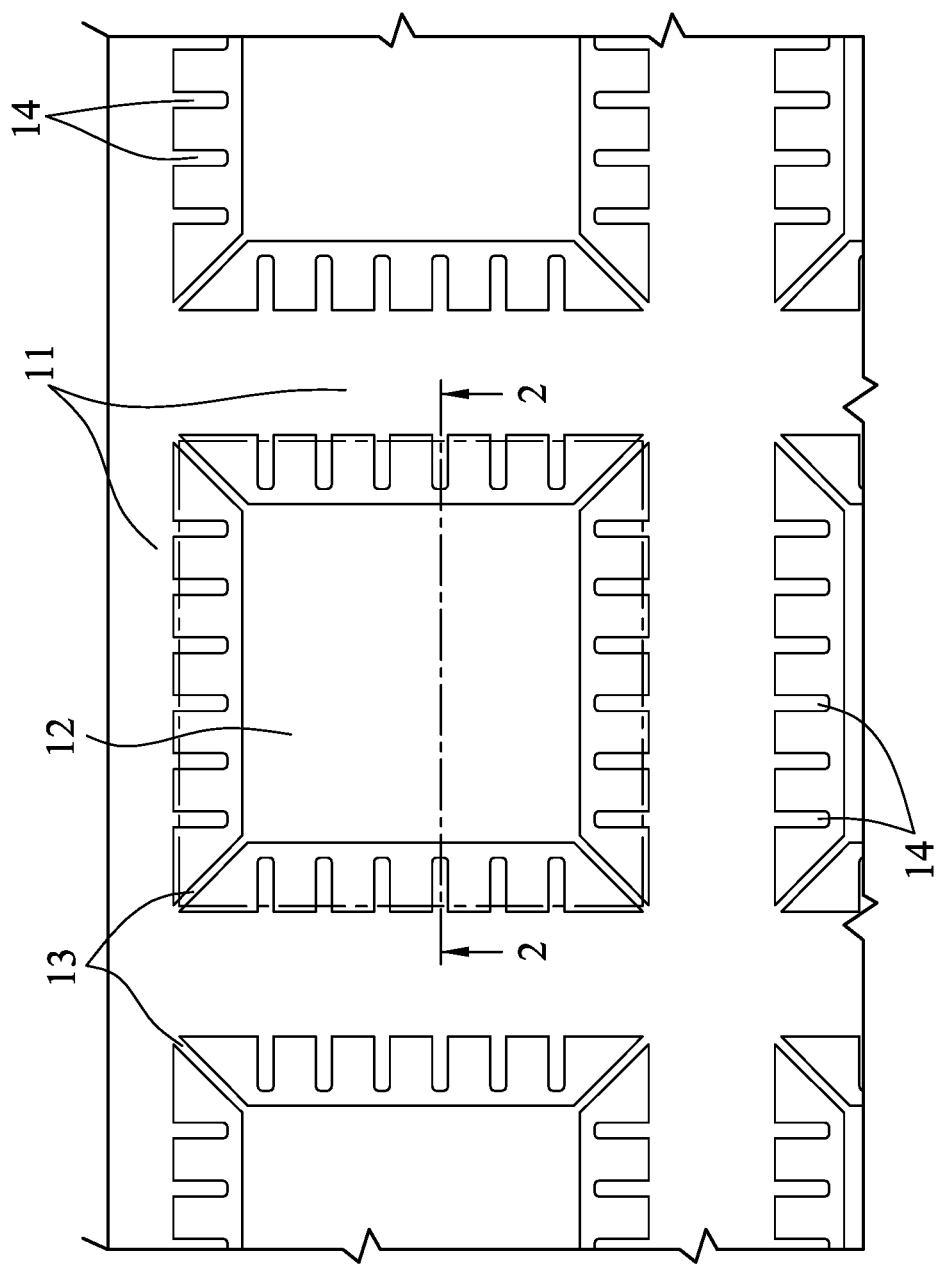
FIG. 1 is a fragmentarily top view illustrating a conventional quad flat no-lead (QFN) lead frame.
Figure 2:
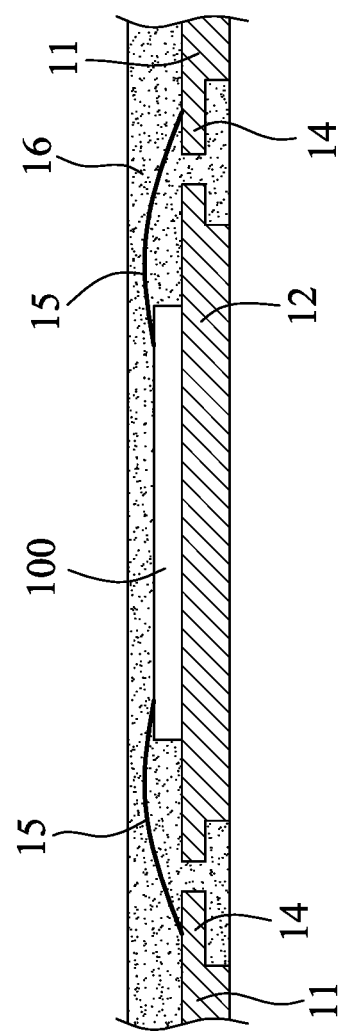
FIG. 2 is a fragmentarily schematic view of a chip packaging device including the conventional QFN lead frame of FIG. 1.
Figure 3:
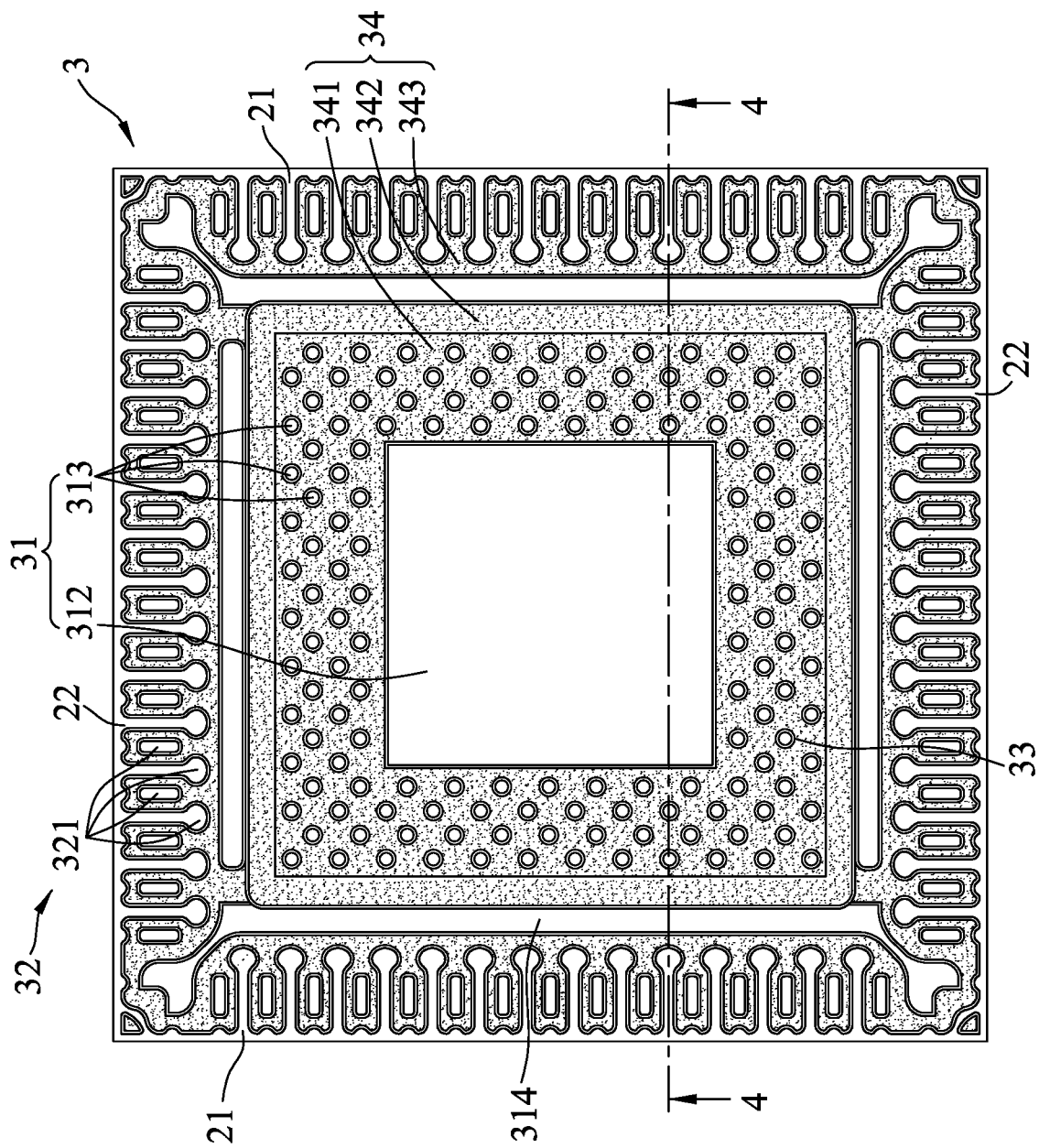
FIG. 3 is a fragmentarily top view illustrating an embodiment of a preformed lead frame device according to the disclosure.
Figure 4:
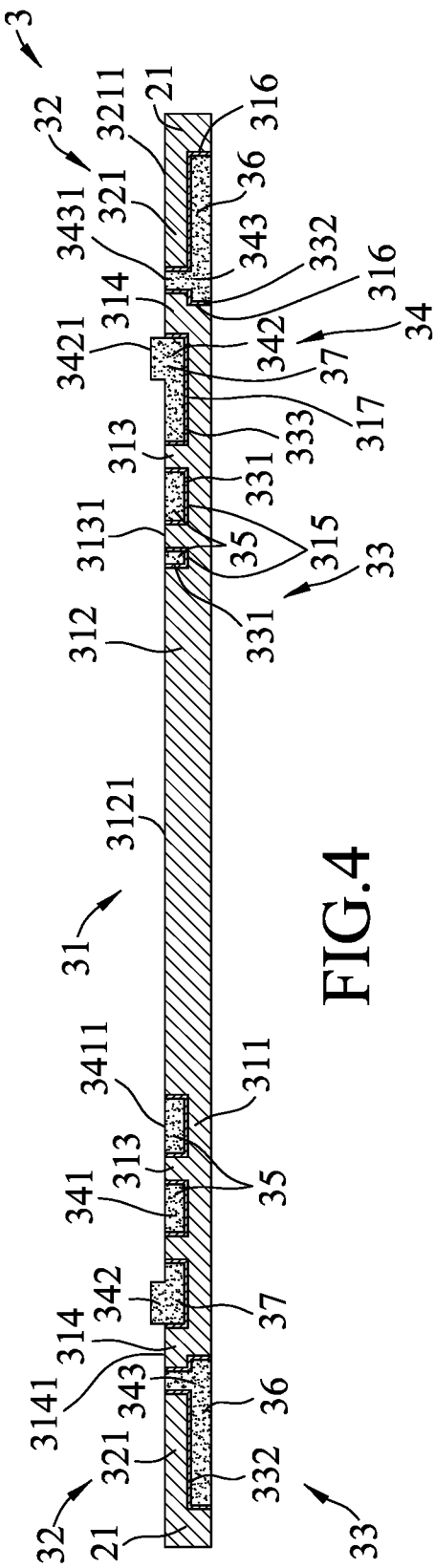
FIG. 4 is a fragmentarily cross-sectional view taken along a line 4-4 of FIG. 3.

Referring to FIGS. 3 and 4, an embodiment of a preformed lead frame device according to the disclosure is encapsulated together with a chip supported thereon so as to forma chip packaging device. The embodiment of the preformed lead frame device includes a plurality of spaced-apart longitudinal sections 21 and a plurality of spaced-apart transverse sections 22 intersecting the longitudinal sections 21, and a plurality of preformed lead frame units 3. Each of the preformed lead frame units 3 is surrounded by two adjacent ones of the longitudinal sections 21 and two adjacent ones of the transverse sections 22.

In FIG. 3, for the sake of brevity, only one of the preformed lead frame units 3 and the two adjacent ones of the spaced-apart longitudinal sections 21 and the two adjacent ones of the spaced-apart transverse sections 22 surrounding the preformed lead frame unit 3 are shown.

The preformed lead frame unit 3 includes a die pad sub-unit 31, a lead sub-unit 32, an adhesion-strengthening layer 33, and a molding layer 34.

The die pad sub-unit 31 of the preformed lead frame unit 3 includes a bottom portion 311, a die pad portion 312 that extends upwardly from the bottom portion 311 and that has a pad top surface 3121 opposite to the bottom portion 311, a plurality of pillar portions 313 that extend upwardly from the bottom portion 311 and that surround the die pad portion 312, and a first gap 35 formed among the die pad portion 312 and the pillar portions 313. Each of the pillar portions 313 has a pillar top surface 3131 opposite to the bottom portion 311. The bottom portion 311, the die pad portion 312 and the pillar portions 313 cooperatively define a first gap-surrounding surface 315 that is exposed to the first gap 35.

The die pad sub-unit 31 further includes a ground portion 314 that extends upwardly from the bottom portion 311, and that has an upper surface 3141 opposite to the bottom portion 311 and exposed from the molding layer 34. In this embodiment, the ground portion 314 is composed of four strip-shaped sections.

In one form, the longitudinal and transverse sections 21, 22, the bottom portions 311, the die pad portions 312, the pillar portions 313, and the ground portion 314 of the die pad sub-units 31 may be made from the same metal material. The die pad portions 312 of the die pad sub-unit 31 and the leads 321 of the lead sub-unit 32 of the preformed lead frame unit 3 may be made from the same metal material.

The lead sub-unit 32 includes a plurality of spaced-apart leads 321 that extend from the two adjacent ones of the longitudinal sections 21 and the two adjacent ones of the transverse sections 22 toward the die pad sub-unit 31. Each of the leads 321 has a lead top surface 3211 opposite to the bottom portion 311 of the die pad sub-unit 31.

The lead sub-unit 32 further includes a second gap 36 formed among the die pad sub-unit 31 and the leads 321. The leads 321 and the die pad sub-unit 31 cooperatively define a second gap-surrounding surface 316 that is exposed to the second gap 36.

In one form, as shown in FIG. 3, the leads 321 extending from one of the longitudinal sections 21 and the transverse sections 22 are formed in double rows. In other forms, the leads 321 extending from the one of the longitudinal sections 21 and the transverse sections 22 may be formed in a single row or in more than two rows based on requirements.

The die pad sub-unit 31 of each of the preformed lead frame units 3 further includes a third gap 37 formed between the ground portion 314 and adjacent ones of the pillar portions 313. The bottom portion 311, the ground portion 314, and the adjacent ones of the pillar portions 313 cooperatively define a third gap-surrounding surface 317 that is exposed to the third gap 37.

The adhesion-strengthening layer 33 includes a first adhesion portion 331 disposed in the first gap 35 to cover the first gap-surrounding surface 315, a second adhesion portion 332 disposed in the second gap 36 to cover the second gap-surrounding surface 316, and a third adhesion portion 333 disposed in the third gap 37 to cover the third gap-surrounding surface 317. In one form, the adhesion-strengthening layer 33 is made of an oxide of the same metal material that is used for making the longitudinal and transverse sections 21, 22. For example, the longitudinal and transverse sections 21, 22 are made of copper (Cu), and the adhesion-strengthening layer 33 is made of cupric oxide (CuO) or cuprous oxide ($Cu_2O$).

The molding layer 34 is made of a polymeric material, especially an electrically isolating material such as epoxy, and is directly formed on the adhesion-strengthening layer 33. The molding layer 34 includes a first molding portion 341, a second molding portion 342, and a third molding portion 343. The first molding portion 341 fills the first gap 35 and covers the first adhesion portion 331 of the adhesion-strengthening layer 33. The second molding portion 342 fills the third gap 37, covers the third adhesion portion 333, and surrounds the pillar portions 313 and the first molding portion 341. The third molding portion 343 fills the second gap 36 and covers the second adhesion portion 332 of the adhesion-strengthening layer 33.

The first molding portion 341 includes a first top surface 3411 opposite to the bottom portion 311 of the die pad sub-unit 31. The second molding portion 342 includes a second top surface 3421 opposite to the bottom portion 311 of the die pad sub-unit 31. The pad top surface 3121 of the die pad portion 312 and the pillar top surfaces 3131 of the pillar portions 313 are flushed with the first top surface 3411 of the first molding portion 341. The first top surface 3411 of the first molding portion 341 and the second top surface 3421 of the second molding portion 342 are different in height.

Figure 5:
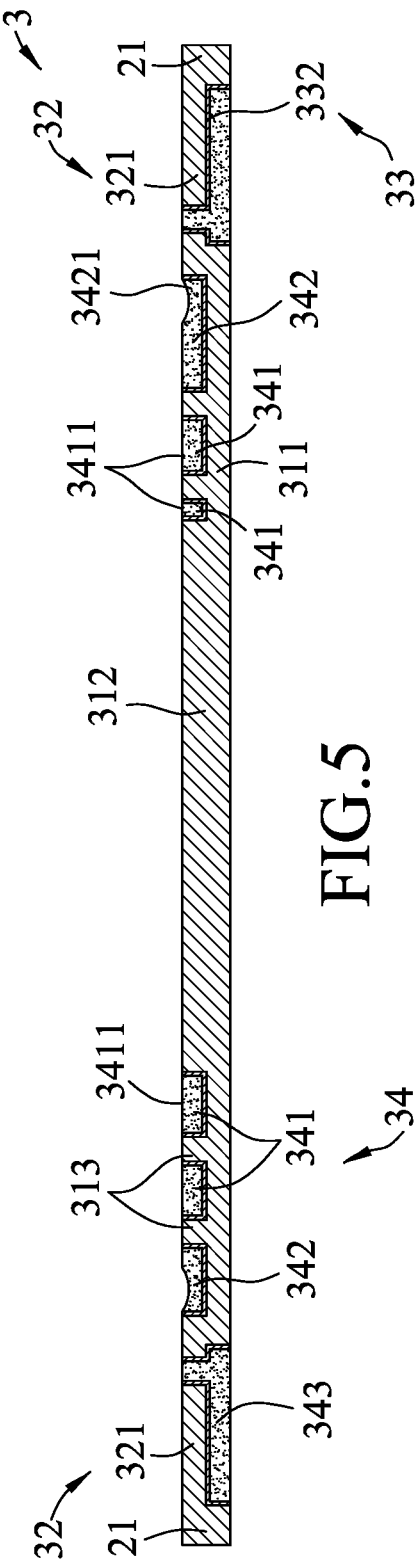
FIG. 5 is a fragmentarily cross-sectional view illustrating another configuration of a second molding portion of the embodiment.

In one form, as shown in FIG. 5, the first top surface 3411 of the first molding portion 341 of the molding layer 34 of each of the preformed lead frame units 3 is higher than that of the second top surface 3421 of the second molding portion 342 of the molding layer 34.

In another form, as shown in FIG. 4, the first top surface 3411 of the first molding portion 341 of the molding layer 34 of each of the preformed lead frame units 3 is lower than that of the second top surface 3421 of the second molding portion 342 of the molding layer 34.

The third molding portion 343 of the molding layer 34 of each of the preformed lead frame units 3 has a third top surface 3431 opposite to the bottom portion 311 of the die pad sub-unit 31. The third top surface 3431 is flushed with the first top surface 3411 of the first molding portion 341 of the molding layer 34.

The pad top surface 3121 of the die pad portion 312, the pillar top surface 3131 of the pillar portions 313, the first top surface 3411 of the first molding portion 341, the second top surface 3421 of the second molding portions 342 and the third top surface 3431 of the third molding portions 343 are exposed externally and are available for subsequent processing steps together with the lead top surfaces 3211 of the leads 321. The subsequent processing steps are, for example, mounting the chip on the die pad sub-unit 31 and electrically connecting the chip to the leads 321.

According to the embodiment of the disclosure, by way of forming the adhesion-strengthening layer 33 on the first gap-surrounding surface 315, the second gap-surrounding surface 316 and the third gap-surrounding surface 317 exposed to the first, second and third gaps 35, 36, 37 formed among the die pad portion 312, the pillar portions 313, and the leads 321, and by way of making the adhesion-strengthening layer 33 using the oxide of the same metal material that is used for making the longitudinal and transverse sections 21, 22, the adhesion strength between the molding layer 34 and the die pad portion 312, the pillar portions 313 and the leads 321 is enhanced. Poor adhesion strength caused by the heterogeneous interface between the preformed lead frame units 3 and the molding layer 34, which are made from incompatible materials such as copper and the polymeric material, which is encountered by the prior art can be improved. Furthermore, the die pad portion 312 and the pillar portions 313 of the die pad sub-unit 31 of each of the preformed lead frame units 3 cooperatively serve as a chip-bearing region of the preformed lead frame unit 3 for mounting chips of variable sizes. Specifically, for each of the preformed lead frame units 3, the die pad portion 312 of the die pad sub-unit 31 can be sized to have an area matching that of the chip, which has a minimum size within a desired range. When the chip intended to be disposed has a size too large to be only supported by the die pad portion 312, the pillar portions 313 are auxiliary to the die pad portion 312 for mounting the chip. In addition, in the form of the second top surface 3421 of the second molding portion 342 of the molding layer 34 higher than that of the first top surface 3411 of the first molding portion 341, the second molding portion 342 can serve as a retaining wall to prevent overflowing of a solder, such as a tin-based solder that is applied for connecting the chip to the chip-bearing region in the subsequent chip-mounting operation, thereby preventing the failure of the chip packaging device.

Referring back to FIG. 5, for each of the preformed lead frame units 3, in the form of the first top surface 3411 of the first molding portion 341 of the molding layer 34 higher than that of the second top surface 3421 of the second molding portion 342 of the molding layer 34, the second top surface 3421 of the second molding portion 342 can serve as a solder-receiving groove for receiving the overflowing solder during the subsequent chip-mounting operation.

When the preformed lead frame device is manufactured, a substrate (not shown) that is made of an electrically conductive material, such as copper, a copper-based alloy or an iron-nickel based alloy, is first provided. The substrate is then defined with the spaced apart longitudinal regions 21 and the spaced-apart transverse regions 22 arranged in an array of rows and columns.

The substrate is then patterned to remove an unnecessary portion using etching techniques so as to forma semi-finished product of the performed lead frame device. Referring back to FIG. 3, the semi-finished product includes the spaced-apart longitudinal and transverse sections 21, 22, and a plurality of the preformed lead frame units 3, each of which is surrounded by the two adjacent ones of the longitudinal sections 21 and the two adjacent ones of the transverse sections 22, and includes the die pad sub-unit 31 and the lead sub-unit 32. The longitudinal sections 21 and the transverse sections 22 are connected to the bottom portions 311 of the die pad sub-units 31 of the preformed lead frame units 3.

Subsequently, the semi-finished product is subjected to a chemical treatment with an acidic solution. Examples of the acidic solution may include, but are not limited, cupric sulfate, sodium thiosulfate, sodium citrate, and potassium sodium tartrate. The first, second and third gap-surrounding surfaces 315, 316, 317 and the first, second and third gaps 35, 36, 37 as mentioned above are formed, accordingly. A layer of cupric oxide or cuprous oxide is then formed on the first, second and third gap-surrounding surfaces 315, 316, 317 so as to form the adhesion-strengthening layer 33 shown in FIG. 3.

The semi-finished product is then disposed in a mold (not shown), and then an encapsulating material is filled in the first, second and third gaps 35, 36, 37 to cover the adhesion-strengthening layer 33 without covering the pad top surfaces 3121 of the die pad portions 312 and the lead top surfaces 3211 of the leads 321, and the bottom surfaces opposite to the top surfaces, followed by curing of the encapsulating material. The encapsulating material may be selected from insulating polymeric materials such as epoxy resin and the like, to form the molding layer 34 on the adhesion-strengthening layer 33. The thus formed final product of the preformed lead frame device is partly shown in FIG. 3.

Figure 6:
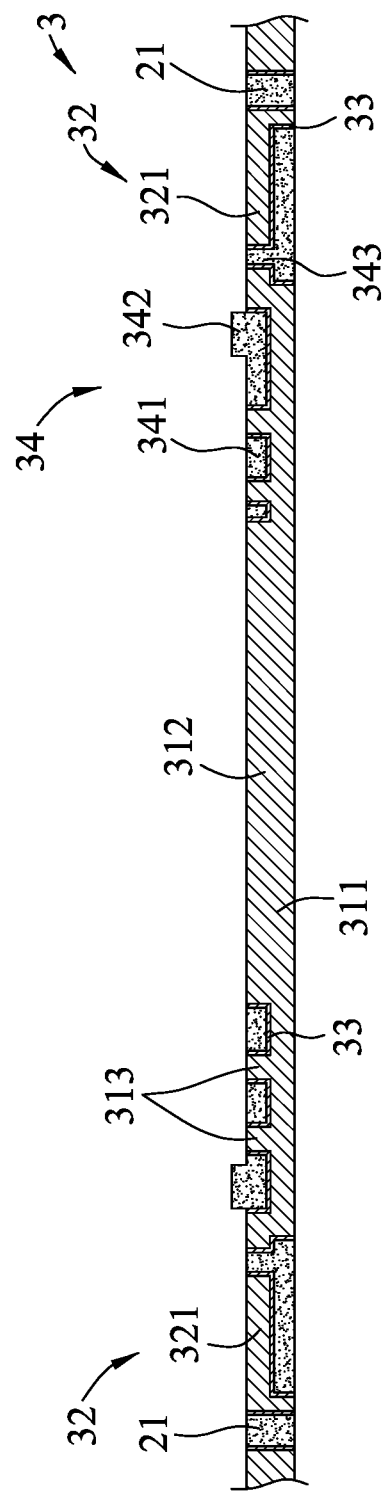
FIG. 6 is a fragmentarily cross-sectional view illustrating another configuration of the embodiment.

Referring to FIG. 6, still another configuration of the embodiment of the preformed lead frame device is illustrated. In this configuration, the longitudinal and transverse sections 21, 22 are made of a polymeric material. For example, the longitudinal and transverse sections 21, 22 are made of the same polymeric material as the molding layer 34, and are integrally formed with the molding layers 34 of the preformed lead frame units 3, and thus formation of the ground portions 314 is dispensed.

Furthermore, with the configuration shown in FIG. 6, the longitudinal and transverse sections 21, 22 made of the polymeric material can serve as cutting paths. By including the preformed lead frame device of the disclosure in the chip packaging device, the chip and the encapsulating layer can be diced along the cutting paths formed in the longitudinal and transverse sections 21, 22, and wearing out of cutting tools can be avoided.

The configuration of the preformed lead frame device shown in FIG. 6 can be manufactured using semi-etching techniques such as those disclosed in Taiwanese Utility Model Patent Publication No. M523189. Since semi-etching techniques are well known in the art, further details thereof are omitted herein for the sake of brevity.

To sum up, by virtue of forming the adhesion-strengthening layer 33, the adhesion strength between the molding layer 34 and the preformed lead frame units 3 can be improved. Furthermore, the die pad portion 312 and the pillar portions 313 of the die pad sub-unit 31 of each of the preformed lead frame units 3 cooperatively serve as a chip-bearing region of the preformed lead frame unit 3 for mounting chips of variable sizes. In addition, the second top surface 3421 of the second molding portion 342 of the molding layer 34 can be designed to be higher or lower than that of the first top surface 3411 of the first molding portion 341, and the second molding portion 342 can serve as the retaining wall to prevent overflowing of solder, or as the solder-receiving groove for receiving the overflowing solder in the subsequent chip-mounting operation, thereby preventing the failure of the chip packaging device.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A preformed lead frame device, comprising:
a plurality of spaced-apart longitudinal sections;
a plurality of spaced-apart transverse sections intersecting said longitudinal sections; and
a plurality of preformed lead frame units, each of said preformed lead frame units surrounded by two adjacent ones of said longitudinal sections and two adjacent ones of said transverse sections and including:
a die pad sub-unit including
a bottom portion,
a die pad portion that extends upwardly from said bottom portion and that has a pad top surface opposite to said bottom portion,
a plurality of spaced-apart pillar portions that extend upwardly from said bottom portion and that surround said die pad portion, each of said pillar portions having a pillar top surface opposite to said bottom portion, and
a first gap formed among said die pad portion and said pillar portions, said bottom portion, said die pad portion and said pillar portions cooperatively defining a first gap-surrounding surface that is exposed to said first gap;
a lead sub-unit including
a plurality of spaced-apart leads extending from said two adjacent ones of said longitudinal sections and said two adjacent ones of said transverse sections toward the die pad sub-unit, each of said leads having a lead top surface opposite to said bottom portion of said die pad sub-unit, and
a second gap formed among said die pad sub-unit and said leads, said leads and said die pad sub-unit cooperatively defining a second gap-surrounding surface that is exposed to said second gap;
an adhesion-strengthening layer including a first adhesion portion disposed in said first gap to cover said first gap-surrounding surface and a second adhesion portion disposed in said second gap to cover said second gap-surrounding surface; and
a molding layer being made of a polymeric material, and including a first molding portion filling said first gap and covering said first adhesion portion of said adhesion-strengthening layer, a second molding portion surrounding said pillar portions and said first molding portion, and a third molding portion filling said second gap and covering said second adhesion portion of said adhesion-strengthening layer,
wherein
said die pad sub-unit and said leads are made of the same metal material, and said adhesion-strengthening layer is made of an oxide of the same metal material; and
said first molding portion includes a first top surface opposite to said bottom portion of said die pad sub-unit, said second molding portion including a second top surface opposite to said bottom portion of said die pad sub-unit, said pad top surface of said die pad portion and said pillar top surfaces of said pillar portions being flushed with said first top surface of said first molding portion, said first top surface of said first molding portion and said second top surface of said second molding portion being different in height.

2. The preformed lead frame device of claim 1, wherein said die pad sub-unit and said leads are made of copper, and said adhesion-strengthening layer is made of cupric oxide (CuO) or cuprous oxide ($Cu_2O$).

3. The preformed lead frame device of claim 1, wherein said first top surface of said first molding portion of said molding layer of each of said preformed lead frame units is higher than that of said second top surface of said second molding portion of said molding layer.

4. The preformed lead frame device of claim 1, wherein said first top surface of said first molding portion of said molding layer of each of said preformed lead frame units is lower than that of said second top surface of said second molding portion of said molding layer.

5. The preformed lead frame device of claim 1, wherein said third molding portion of said molding layer of each of said preformed lead frame units has a third top surface opposite to said bottom portion of said die pad sub-unit, said third top surface being flushed with said first top surface of said first molding portion of said molding layer.

6. The preformed lead frame device of claim 1, wherein said die pad sub-unit of each of said preformed lead frame units further includes a ground portion that extends upwardly from said bottom portion and that is disposed between said second molding portion and said third molding portion, said ground portion having an upper surface opposite to said bottom portion and being exposed from said molding layer.

7. The preformed lead frame device of claim 6, wherein said die pad sub-unit of each of said preformed lead frame units further includes a third gap formed between said ground portion and adjacent ones of said pillar portions, said bottom portion, said ground portion and said adjacent ones of said pillar portions cooperatively defining a third gap-surrounding surface exposed to said third gap; and
wherein said adhesion-strengthening layer further includes a third adhesion portion disposed in said third gap to cover said third gap-surrounding surface, said second molding portion filling said third gap to cover said third adhesion portion.

8. The preformed lead frame device of claim 1, wherein said longitudinal sections, said transverse sections and said die pad sub-units of said preformed lead frame units are made of the same metal material.

9. The preformed lead frame device of claim 1, wherein said longitudinal sections and said transverse sections are made of the polymeric material for making said molding layer and are integrally formed with said molding layer.

* * * * *